US012598820B2

(12) United States Patent
Wang et al.

(10) Patent No.: US 12,598,820 B2
(45) Date of Patent: Apr. 7, 2026

(54) METHOD FOR MANUFACTURING NOVEL BUSBARLESS SOLAR PHOTOVOLTAIC MODULE

(71) Applicant: Suzhou Maizhan Automation Technology Co., Ltd., Suzhou (CN)

(72) Inventors: Xin Wang, Suzhou (CN); Jing Zheng, Suzhou (CN)

(73) Assignee: Suzhou Maizhan Automation Technology Co., Ltd., Suzhou (CN)

( * ) Notice: Subject to any disclaimer, the term of this patent is extended or adjusted under 35 U.S.C. 154(b) by 0 days.

(21) Appl. No.: 18/614,967

(22) Filed: Mar. 25, 2024

(65) Prior Publication Data

US 2024/0234608 A1    Jul. 11, 2024

Related U.S. Application Data

(63) Continuation of application No. PCT/CN2023/087899, filed on Apr. 12, 2023.

(30) Foreign Application Priority Data

Aug. 22, 2022    (CN) .......................... 202211005982.4

(51) Int. Cl.
H10F 19/90        (2025.01)
(52) U.S. Cl.
CPC .................................. H10F 19/908 (2025.01)
(58) Field of Classification Search
CPC .... H10F 19/902; H10F 19/904; H10F 19/906; H10F 19/908; H10F 77/211
See application file for complete search history.

(56) References Cited

U.S. PATENT DOCUMENTS

2015/0107645 A1    4/2015  Bitnar

FOREIGN PATENT DOCUMENTS

| CN | 105489675 | A | 4/2016 |
| CN | 106784050 | A | 5/2017 |
| CN | 210403748 | U | 4/2020 |
| CN | 211455701 | U | 9/2020 |
| CN | 112447874 | A | 3/2021 |

(Continued)

OTHER PUBLICATIONS

CN 216145631 U English Translaiton provided by FIT database.*

(Continued)

*Primary Examiner* — Golam Mowla
(74) *Attorney, Agent, or Firm* — Nitin Kaushik

(57)        ABSTRACT

The present invention discloses a method for manufacturing a novel busbarless solar photovoltaic module and relates to the technical field of solar photovoltaic device manufacturing. The present invention uses a metal connecting ribbon to connect a cell and the front and back of the cell are designed to remove PAD points, which reduces optical occlusion on the surface of the cell and costs, and by using fixtures and manipulators to weld the metal connecting ribbon and the cell into a cell string and by applying and curing an adhesion point on the metal connecting ribbon of the cell string, the risk of unstable connection is completely eliminated. In addition, the requirement for alignment between the metal connecting ribbon and a finger of the cell is reduced, thereby simplifying the manufacturing process of the cell string.

16 Claims, 5 Drawing Sheets

(56)     References Cited

FOREIGN PATENT DOCUMENTS

| | | | |
|---|---|---|---|
| CN | 112490330 | A | 3/2021 |
| CN | 212783469 | U | 3/2021 |
| CN | 112951937 | A | 6/2021 |
| CN | 114023842 | A | 2/2022 |
| CN | 114078983 | A | 2/2022 |
| CN | 216145631 | U | 3/2022 |
| CN | 216288476 | U | 4/2022 |
| CN | 114765229 | A | 7/2022 |
| CN | 115224161 | A | 10/2022 |
| CN | 217788422 | U | 11/2022 |
| EP | 2650927 | A1 | 10/2013 |
| JP | 2013152965 | A | 8/2013 |
| JP | 2016036029 | A | 3/2016 |
| KR | 1020180050263 | A | 5/2018 |
| KR | 20180084453 | A | 7/2018 |
| KR | 1020240002978 | A | 1/2024 |

OTHER PUBLICATIONS

Title of the Item: KR10-2024-7015814—Notice of Allowance Publication Date: Sep. 28, 2025 Applicant: Suzhou Maizhan Automation Technology Co., Ltd. Country: KR.

* cited by examiner

Metal connecting ribbon

Cell

Transition section

Connecting fork

METHOD FOR MANUFACTURING NOVEL BUSBARLESS SOLAR PHOTOVOLTAIC MODULE

CROSS-REFERENCE TO RELATED APPLICATIONS

The application claims priority to Chinese patent application Ser. No. 2022110059824, filed on Aug. 22, 2022, the entire contents of which are incorporated herein by reference.

TECHNICAL FIELD

The present invention relates to the technical field of solar photovoltaic device manufacturing, and in particular, to a method for manufacturing a novel busbarless solar photovoltaic module.

BACKGROUND

In the field of solar photovoltaic modules at home and abroad, conventional solar photovoltaic modules generally have silver deposited on surfaces of solar photovoltaic cells by screen printing and other methods to form conductive grid lines and also have busbars and pad points printed at designated positions to improve mechanical strength and form good electrical contact. Such solar photovoltaic modules can work stably and normally in an appropriate working environment and ensure good power generation performance, but during the manufacturing process of cell strings thereof, the cell busbars or pad points and the metal connecting ribbons are welded to form a stable electrical connection, and the metal connecting ribbons and the cell busbars are required to be highly aligned; the cross-section of the metal connecting ribbon used is rectangular, circular, or triangular, with small welding contact area and ordinary welding performance; meanwhile, silver paste forms optical occlusion to some extent on the surface of the cell, causing optical loss of the photovoltaic cell. Moreover, the extensive use of silver paste increases the cost of photovoltaic modules and is not conducive to the development of solar photovoltaic modules.

For a heterojunction solar cell, the SWCT technology is adopted, that is, metal connecting ribbons are combined with composite films first, and then film-ribbon composite units are connected to the cell. This technology greatly reduces the requirement for aligning metal connecting ribbons with grid lines, and the transparent composite film can achieve the same mechanical properties as welding to some extent. At the same time, during the lamination process, metal connecting ribbons and silver paste form a stable electrical contact. However, individual cell string units used in this technology are expensive to manufacture in the prior art, the internal composite film has poor temperature resistance and light transmittance, and multi-strand metal connecting ribbons are in unstable contact with silver paste, thus reducing electrical conductivity.

SUMMARY

1. Technical Problems Solved

The present invention provides a method for manufacturing a novel busbarless solar photovoltaic module to solve the problems that composite films used in the prior art are easy to cause serious optical occlusion and conventional cells are prone to reduced light transmittance, degraded electrical conductivity, and insufficient welding strength during manufacturing.

2. Technical Solution

To achieve the above objectives, a technical solution provided by the present invention is as follows: a method for manufacturing a novel busbarless solar photovoltaic module, where the method includes the following steps: use a metal connecting ribbon to connect a cell unit: move a metal connecting ribbon cut to a required length to a workstation, then place a cell at a required position, cut another section of metal connecting ribbon and place it on the cell, fix the metal connecting ribbon with a fixing piece and place another cell at the same time, and repeat the steps of cutting the metal connecting ribbon and placing the cell; weld: gradually transport the arranged metal connecting ribbons-cells-metal connecting ribbons-fixing pieces to a welding workstation and weld the metal connecting ribbons and the cells by heating; apply an adhesion point: apply an adhesion point at a designated position on the surface of the welded metal connecting ribbon; cure: after curing the adhesion point on the front of a cell string, turn the cell string over, apply an adhesion point on the back of the cell string, and cure the adhesion point to complete the cell string; and make a complete circuit: arrange a plurality of the completed cell strings according to a certain rule, and connect these cell strings in a certain way through welding to form a required complete circuit.

As a further improvement of the present invention, the cross-section of the metal connecting ribbon can be triangular, circular, or rectangular with an area of 0.005~0.55 $mm^2$.

As a further improvement of the present invention, the outer layer of the metal connecting ribbon is a coating of low melting point alloy or pure metal with a melting point of 120~250° C.

As a further improvement of the present invention, the metal connecting ribbon is soaked or coated with flux before welding, or a coating with a soldering effect is pre-coated on the surface of the metal connecting ribbon.

As a further improvement of the present invention, a method for applying an adhesion point is coating without a fixture, the fixture is an integral fixture, and after the welding is completed, the fixture is removed and the adhesion point is applied to a corresponding position of the cell for fixing and cured in a special way.

As a further improvement of the present invention, a method for applying an adhesion point is coating with a fixture, when the adhesion point is applied, a solder ribbon fixture is used and the solder ribbon is always bound.

As a further improvement of the present invention, the adhesion point has a hemispherical or semi-ellipsoidal shape as a whole, and the bottom surface of the applied adhesion point is a circle or a short line formed by a dense arrangement of multiple points.

As a further improvement of the present invention, each cell string includes a head cell, a tail cell, and at least one intermediate cell between the head cell and the tail cell, and adjacent cells are electrically connected by the metal connecting ribbon.

As a further improvement of the present invention, a thickened portion is formed by screen printing at a designated position on a finger of the cell, and the designated position is a part of the finger that needs to be connected to the metal connecting ribbon.

As a further improvement of the present invention, in a series connection direction of the cell, a reserved busbar and a connecting fork connected to the finger are disposed in both end areas of the cell, the thickened portion is a transition section on the finger at an intersection position with the reserved busbar, one end of the transition section is connected to the reserved busbar and the other end thereof is connected to the finger; and the width of the transition section gradually narrows from the end close to the reserved busbar to the other end far away from the reserved busbar.

As a further improvement of the present invention, thickened portions are formed by screen printing at designated positions on fingers 1~8 at both ends of the cell, and the thickened portions are distributed at a spacing or in close proximity.

As a further improvement of the present invention, thickened portions are formed by screen printing at other positions of the cell except for the both ends thereof, and the thickened portions are distributed at a spacing or in close proximity.

As a further improvement of the present invention, the fingers and the thickened portions are formed by printing at one time.

As a further improvement of the present invention, a first paste is used to print the finger, a second paste is used to print the thickened portion, the first paste has better conductivity than the second paste, and the second paste has better adhesion than the first paste.

As a further improvement of the present invention, the step of applying an adhesion point is achieved by adhesive dispensing or printing.

As a further improvement of the present invention, in the step of welding, the alloy or metal on the surface of the metal connecting ribbon is melted and welded to the cell by heating.

As a further improvement of the present invention, in the step of curing, the cell string is turned over always at 40-140° C., and then the adhesion point is applied to the back of the cell and cured.

In addition, the present invention also claims protection for a solar photovoltaic cell module manufactured by the above method, where the solar photovoltaic cell module includes a plurality of cell strings, where each of the cell strings includes a head cell, a tail cell, and at least one intermediate cell between the head cell and the tail cell; a light-receiving surface of one of adjacent cells is electrically connected to a backlight surface of the other one of the adjacent cells through a metal connecting ribbon, and a separate metal connecting ribbon is disposed on a backlight surface of the head cell and on a light-receiving surface of the tail cell respectively to electrically lead out the cell respectively; and the metal connecting ribbon is connected to the front and back of the cell by welding and intersects with a finger of the cell, and at least one adhesion point is also disposed on the metal connecting ribbon on the surface of the cell.

3. Beneficial Effects

Compared to the prior art, the technical solution provided by the present invention has the following beneficial effects:

By welding at least one head cell, at least one tail cell, the fronts and backs of the cells, and flux-adhered solder ribbons together at a spacing up and down in order, and by using fixtures and manipulators to arrange the flux-adhered solder ribbons cut to multiple strands, the cells, and other materials in order, the present invention enables that the fronts and backs of the connected cells are welded into a cell string by relying on the multiple strands of flux-adhered solder ribbons and that the risk of unstable connection is completely eliminated by applying an adhesion point and curing it. In addition, the requirement for alignment between the metal connecting ribbon and a finger of the cell is reduced, thereby simplifying the manufacturing process of the cell string. At the same time, the elimination of composite films and PAD points on the front and back of the cell effectively reduces optical occlusion on the surface of the cell and greatly decreases the production cost.

DETAILED DESCRIPTION OF THE EMBODIMENTS

Figure 1:
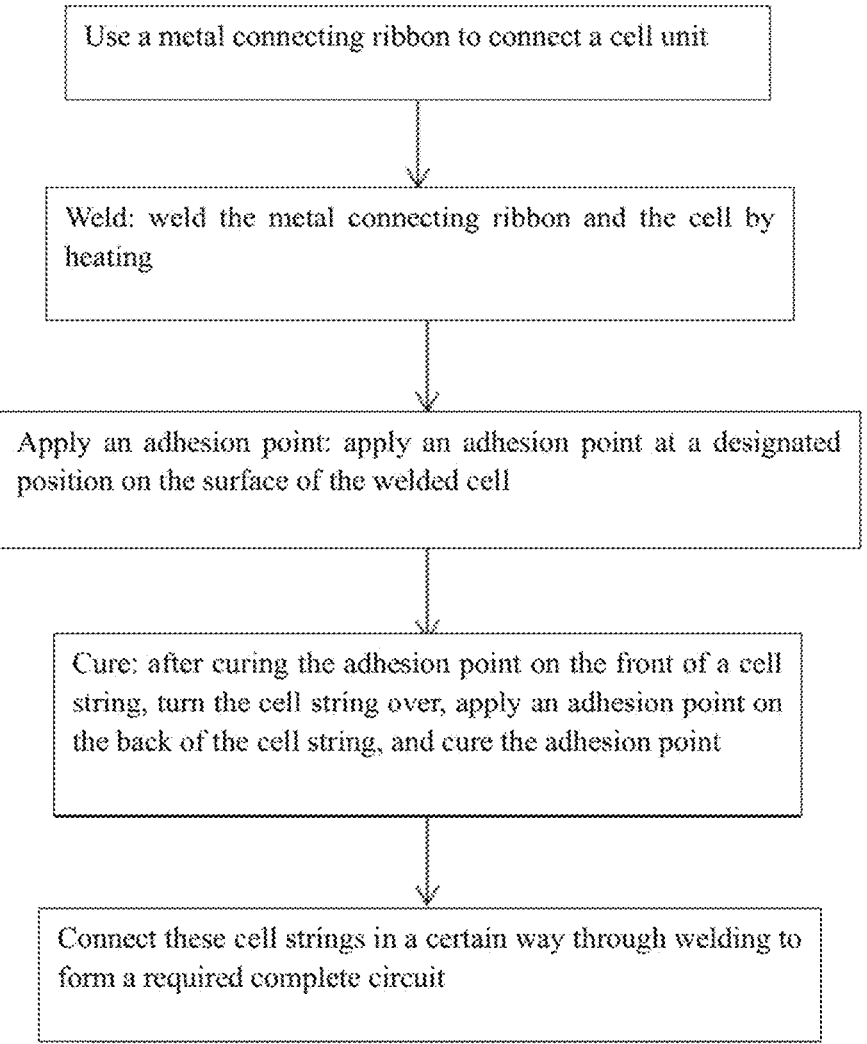
FIG. 1 is a flow chart of a method for manufacturing a novel busbarless solar photovoltaic module according to the present invention.

In order to further understand the content of the present invention, the present invention will be described in detail with reference to the accompanying drawings and embodiments.

The structures, proportions, sizes, etc. shown in the drawings of the specification are only used to coordinate with the content disclosed herein for the understanding and reading of those skilled in the art rather than to limit the conditions under which the present invention can be implemented. Therefore, they have no technically substantive significance, and any structural modifications, changes in proportions, or adjustments in sizes should still fall within the scope of the technical content disclosed herein without affecting the effectiveness and objectives of the present invention. At the same time, as used herein, the terms such as "up", "down", "left", "right", and "middle" are only for the convenience of description but not for limiting the scope of implementation, and changes or adjustments in their relative relationships should also be deemed to be within the scope of implementation of the present invention provided that there is no substantial change in the technical content.

Embodiment 1

Figure 2:
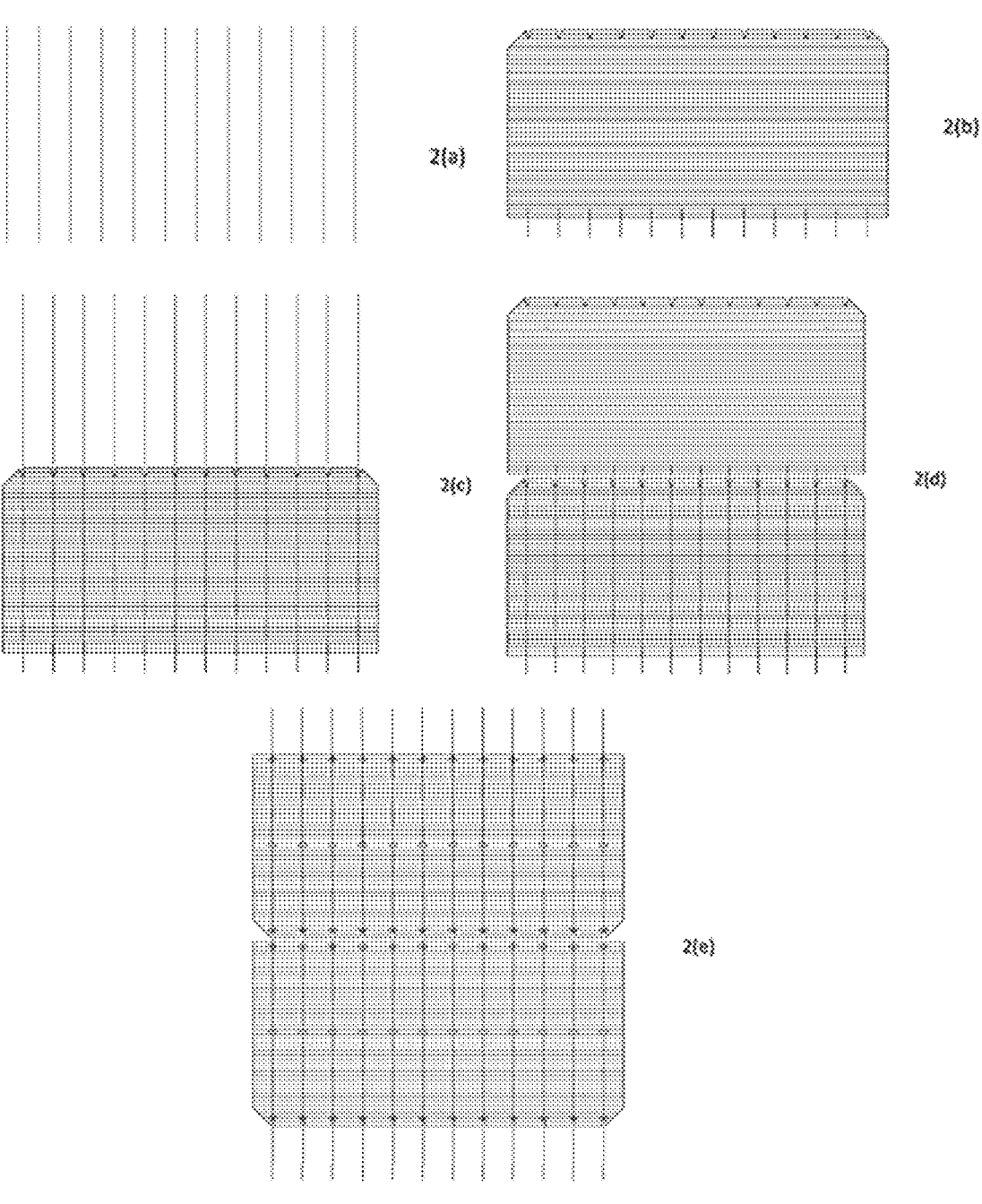
FIG. 2 is a flow chart of a method for manufacturing a novel busbarless solar photovoltaic module according to the present invention.
Figure 3:
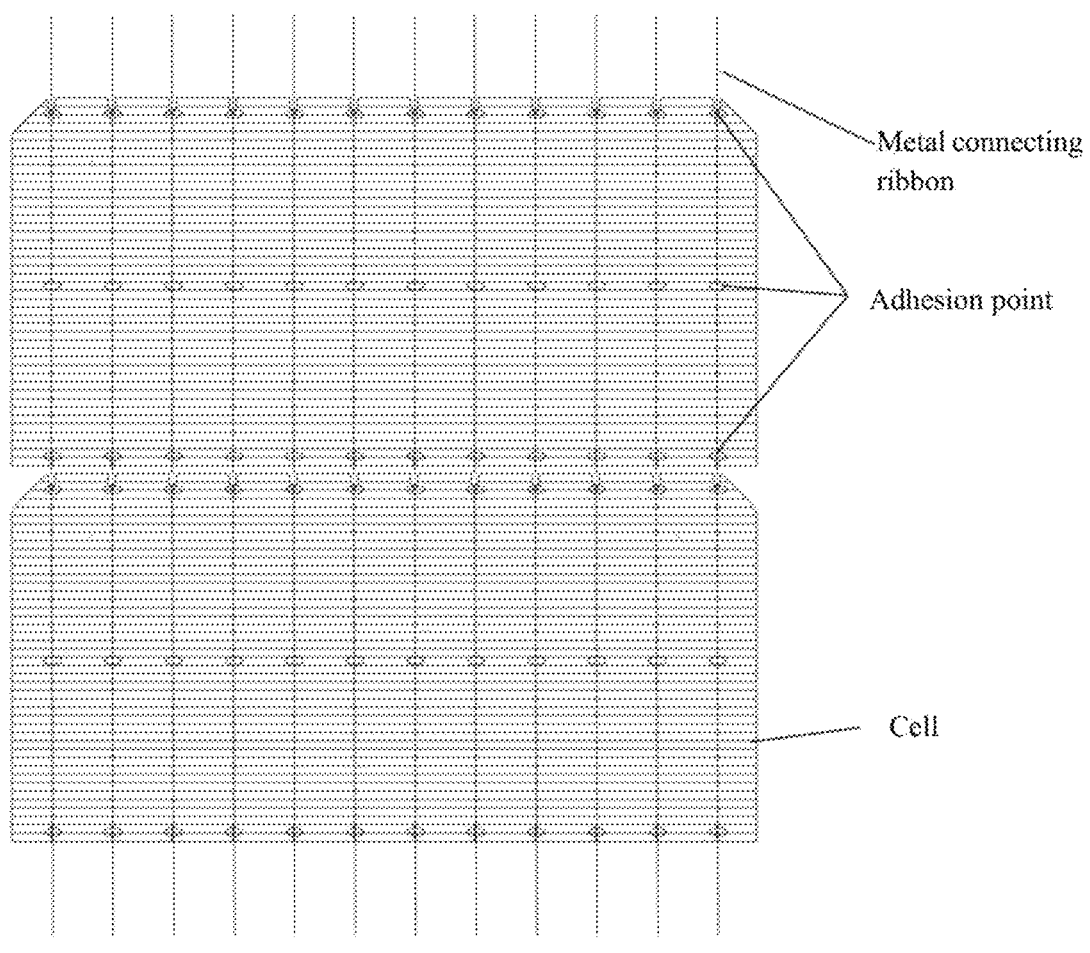
FIG. 3 is a schematic diagram of connection between a cell and a metal connecting ribbon of a busbarless solar photovoltaic module according to the present invention.

A first embodiment of the present invention, referring to FIG. 1, provides a method for manufacturing a novel busbarless solar photovoltaic module. By improving solar cells and adjusting process flows, the present invention effectively solves problems such as reduced light transmittance, degraded conductivity, and high cost of cells in conventional processes. The process flow of the embodiment is as follows:

S1: use a metal connecting ribbon to connect a cell unit:

move a metal connecting ribbon cut to a required length to a workstation, as shown in FIG. 2(*a*); then place a cell at a required position, as shown in FIG. 2(*b*); cut another section of metal connecting ribbon and place it on the cell, as shown in FIG. 2(*c*); fix the metal connecting ribbon with a fixing piece and place another cell at the same time, as shown in FIG. 2(*d*); and repeat the steps of cutting the metal connecting ribbon and placing the cell;

Here, the cross-section of the metal connecting ribbon can be triangular, circular, or rectangular, and metal connecting ribbons of different cross-sectional shapes can be selected depending on application scenarios and product requirements;

Optionally, the metal connecting ribbon used for connection can have a cross-sectional area of 0.005-0.55 mm$^2$;

Optionally, the outer layer of the metal connecting ribbon used for forming a connection with the cell during the welding process is a coating of low melting point alloy or pure metal with a melting point of 120~250° C.

Figure 4:
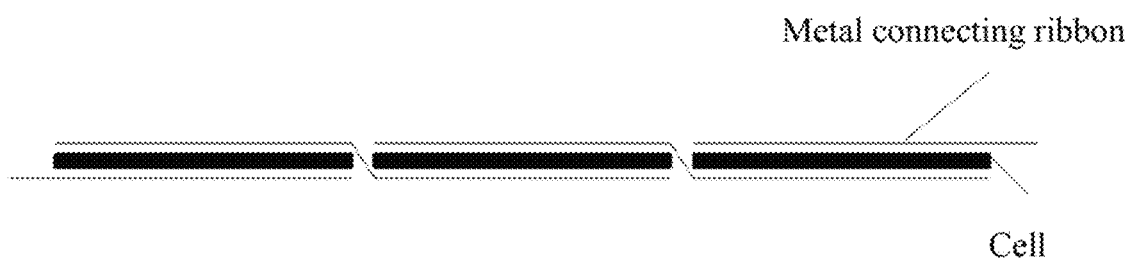
FIG. 4 is a schematic diagram of a single cell string connection structure of a busbarless solar photovoltaic module according to the present invention.

Optionally, the metal connecting ribbon is soaked or coated with flux before welding, or a coating with a soldering effect is pre-coated on the surface of the metal connecting ribbon so that during the welding process, a solder ribbon can form a stable connection with the surface and finger of the cell;

S2: gradually transport the arranged metal connecting ribbons-cells-metal connecting ribbons-fixing pieces (fixtures) to a welding workstation, melt the alloy or metal on the surface of the metal connecting ribbon by heating, and connect it with the surface and finger of the cell;

In this step, the metal connecting ribbon is heated by infrared heating or other methods so that the cell and the metal connecting ribbon are initially welded together; the cell and the metal connecting ribbon are connected by a method as shown in FIG. 4; and each cell string consists of a head cell, a tail cell, and at least one intermediate cell between the head cell and the tail cell.

S3: apply an adhesion point at a designated position of the welded cell-metal connecting ribbon, as shown in FIG. 2(*e*);

Regarding the quantity of adhesion points to be applied, during the entire process, too many adhesion points will directly lead to more difficulty and a longer cycle in the process of applying an adhesion point; however, too few adhesion points will lead to unsatisfactory reinforcement of connection strength between the metal connecting ribbon and the cell. Therefore, depending on the shading area and mechanical performance requirements, the quantity of adhesion points can be 3-8 rows.

Furthermore, a method for applying an adhesion point can be coating without or with a fixture.

For coating without a fixture, the metal connecting ribbon and the cell have been welded after the welding process, the fixture in the process step is an integral fixture, and after welding is completed, the fixture is removed and the adhesion point is applied to a corresponding position of the cell for fixing and cured in a special way.

For coating with a fixture, considering running stability, it is ensured that the metal connecting ribbon is closely attached to the surface of the cell, that the metal connecting ribbon and the cell are always bound before the adhesion point is applied for fixing, and that coating with a fixture can also be implemented without interfering with the work of the coating mechanism. Here, a hollow fixture, a split-type fixture, or a combination thereof can be adopted for coating with a fixture, for example, the fixture is hollowed so that coating can be applied at the hollow position of the fixture, or a main fixture and an auxiliary fixture are arranged to ensure that one of the main fixture and the auxiliary fixture is in contact with the cell for coating, or at least one of the main fixture and the auxiliary fixture is hollowed so that coating with a fixture can be applied at the hollow position of the fixture. Specifically, first remove the auxiliary fixtures on both sides of the main fixture, and while retaining the main fixture, apply an adhesion point at the hollow position of the main fixture and the positions of the auxiliary fixtures corresponding to the cell; or first remove the auxiliary fixtures on both sides of the main fixture and apply an adhesion point at the corresponding positions, and then apply an adhesion point in the middle area (the hollow position of the main fixture). Considering running stability, it is ensured that the head and tail of the metal connecting ribbon are closely attached to the surface of the cell, that the metal connecting ribbon is always bound before the adhesion point is applied for fixing, and that the main fixture is hollowed, the auxiliary fixtures are removed before the adhesion point is applied, and the adhesion point is applied at the hollow position of the main fixture and at the positions of the auxiliary fixtures corresponding to the cell without interfering with the work of the adhesion point application mechanism. Furthermore, the adhesion point is applied with a ribbon fixture and during the entire process of applying the adhesion point, it is ensured that at least one of the main fixture and the auxiliary fixtures clamps the cell so that the solder ribbon is always in contact with the surface of the cell to further improve the stability of the connection between the metal connecting ribbon and the cell.

In addition, during the process of applying an adhesion point at a designated position, optionally, a camera is used for auxiliary positioning to ensure that the position of applying the adhesion point can form a good connection with the metal connecting ribbon; the adhesion point can have a circular bottom surface and a hemispherical or semi-elliptical shape as a whole, or the bottom surface of the adhesion point can be a short line formed by a dense arrangement of multiple points, with a certain height in space.

In this step, an adhesion point is applied on the front of the welded cell string and cured, and then the cell string is turned over to have an adhesive point applied on the back thereof.

S4: cure the adhesion point on the front of the cell string; continue to transport the cell string to a next workstation, turn over the cell string while maintaining it at a certain temperature, apply an adhesion point on the back of the cell string, and cure the adhesion point at the same time to complete the cell string.

In this step, the temperature also needs to be maintained at 40~140° C. during the transport process so that the metal thermal stress can be slowly released, and maintaining a certain temperature can ensure that the temperature difference between the welding process and the overturning workstation will not be too large and that large stresses are released after the adhesion point is applied.

It should be noted that after welding, the metal connecting ribbon and the grid line form a stable connection with a bonding force greater than that between the grid line and the cell; if the temperature is not maintained during transport, the metal thermal stress will be released quickly, and when the metal connecting ribbon shrinks, the grid line will be pulled off, which will cause the grid line to break and damage the entire product.

S5: repeat the above steps, arrange a plurality of cell strings according to a certain rule on glass covered with packaging film, connect the cell strings through welding in a certain way to form a required complete circuit, and complete a process including packaging, detection, lamination, and the like in subsequent operations.

In this embodiment, during the welding process, the metal connecting ribbon and the finger need to form an effective electrical connection; the cell string is formed by welding together the head cell, the tail cell, and at least one intermediate cell between the head cell and the tail cell, and fixtures and manipulators are used to arrange the flux-adhered solder ribbons cut to multiple strands, cells, and other materials in order so that the fronts and backs of the connected cells are welded into a cell string by relying on the multiple strands of flux-adhered solder ribbons; and the curing of the adhesion point completely eliminates the risk of unstable connection.

In addition, the adhesion point can be applied by adhesive dispensing or printing, and the adhesive used can be a UV adhesive, a hot melt adhesive, or other adhesives.

It should be noted that in order to improve process efficiency, during the subsequent series connection process of the cell, the adhesion point can be applied to one side of the cell that has been connected in series and then cured. In addition, after a plurality of cells is connected in series, all the cells are subjected to welding, adhesion point application and curing, and overturning on one side thereof first and then on the other side thereof while a certain temperature is maintained to avoid grid lines from breaking due to rapid release of thermal stress.

Embodiment 2

A second embodiment of the present invention, based on the previous embodiment, elaborates on the improvement of a solar photovoltaic cell according to the present invention as follows:

The present invention requires a design without PAD points on the front and back of the cell, and the front and back of the cell can be selected with or without a busbar as required; at the same time, a designated position of a finger of the cell can be thickened as required. According to the conductivity and optical requirements, a photovoltaic module needs to use metal connecting ribbons of different quantities and different diameters to complete the connection between cells, and the designation position is the grid line that needs to be connected to the metal connecting ribbon. In addition, the thickened portion can be arranged to increase the bonding force between the cell and the metal connecting ribbon, ensuring that the metal connecting ribbon is in contact with a finger of the cell before an adhesion point is applied for reinforcement to ensure an effective electrical connection can be formed.

In this embodiment, the shape of the thickened portion is not limited provided that it can achieve the purpose of enhancing the bonding force between the finger and the metal connecting ribbon, and between the finger and the cell, and can be rhombic, triangular, elliptical, etc. In this embodiment, the shape of the thickened portion is rhombic or triangular. The finger and the thickened portion can be formed by printing at one time or at two times step by step. Specifically, according to the requirements for welding stability, the head/tail/middle position of the cell can be thickened by printing at one time or at two times. Optionally, the printing can be screen printing or stencil printing. Preferably, different pastes can be selected for printing at two times. Specifically, when the finger and the thickened portion are formed by printing with different pastes, the paste used for printing the finger has better conductivity than the paste used for printing the thickened portion, and the paste used for printing the thickened portion has better adhesion than the paste used for printing the finger, thereby ensuring both the conductivity of the metal connecting ribbon and the cell and the bonding force at the connection between the metal connecting ribbon and the cell.

Figure 5:
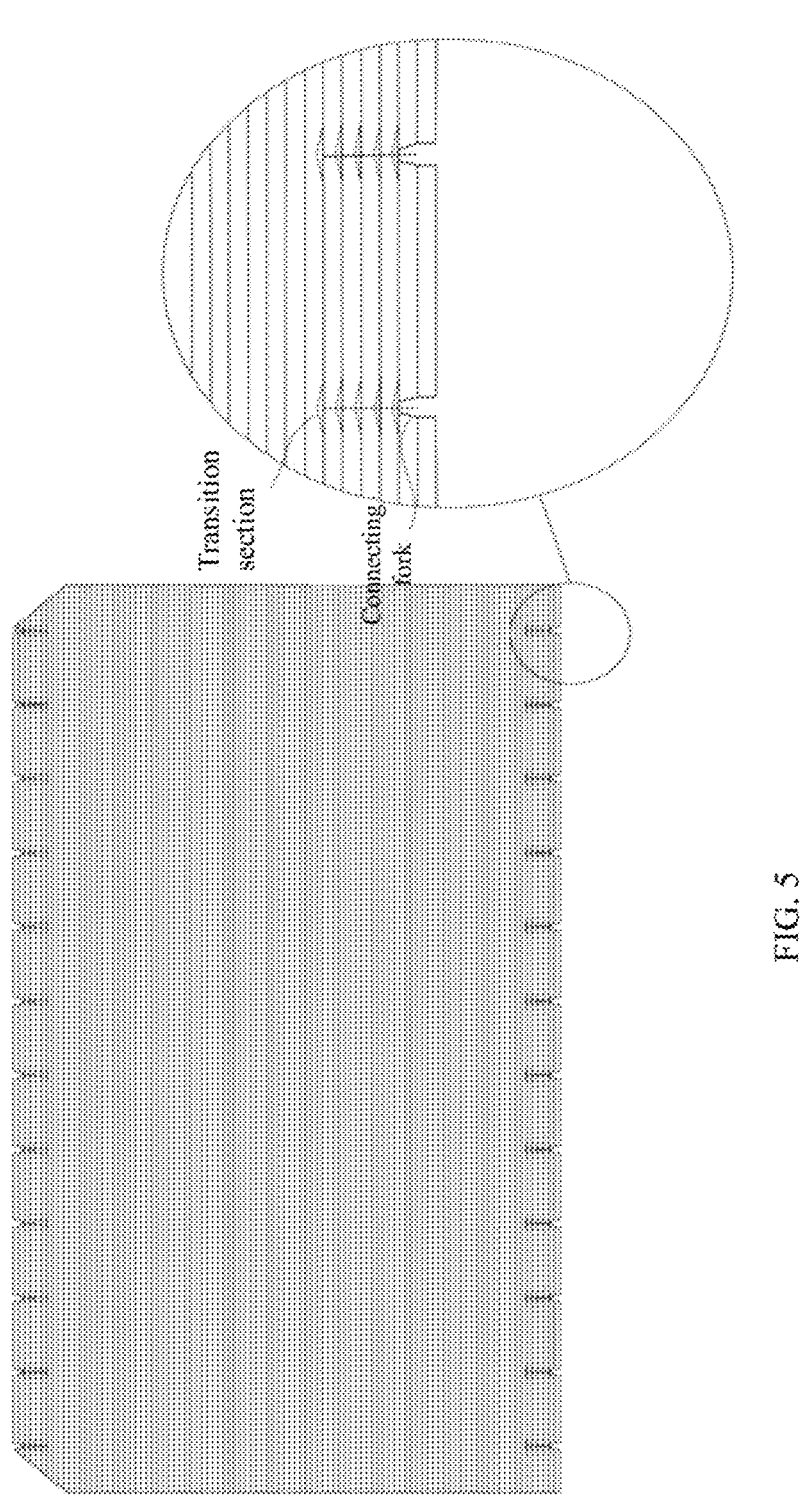
FIG. 5 is a schematic diagram of a cell of a busbarless solar photovoltaic module according to the present invention.

Optionally, as shown in FIG. 5, in a series connection direction of the cell, a reserved busbar and a connecting fork connected to the finger are disposed in both end areas of the cell. The thickened portion is a transition section on the finger at an intersection position with the reserved busbar, one end of the transition section is connected to the reserved busbar and the other end thereof is connected to the finger. Here, the width of the transition section gradually narrows from the end close to the reserved busbar to the other end far away from the reserved busbar, which is conducive to increasing the bonding force between the finger of the cell and the metal connecting ribbon, ensuring that the metal connecting ribbon and the finger can form an effective connection after welding and before applying the adhesion point for reinforcement, and the width of the transition section will also affect the contact area, thereby directly affecting the contact stability.

Optionally, the quantity of fingers with the thickened portion arranged in both end areas of the cell is 1-8, the thickened portion is arranged at an intersection position of the finger and the metal connecting ribbon, and the fingers are distributed at a spacing or in close proximity. In addition to arranging the thickened portion in both end areas of the finger, in order to further share the metal stress and improve stability, the thickened portion can also be arranged in other areas except the end areas of the cell, the quantity of fingers with the thickened portion is 0-5, and these fingers are distributed at a spacing or in close proximity.

In other embodiments, the distribution at a spacing means that starting from the ends of the cell, the thickened portion is arranged at an odd-numbered or even-numbered position, and the distribution in close proximity means that the fingers with the thickened portion are arranged close to each other without any spacing.

The present invention and its embodiments have been illustratively described above, but the description is not limiting, what is shown in the drawings is only one embodiment of the present invention, and the actual structure is not limited thereto. Therefore, if a person of ordinary skill in the art is inspired thereby to devise structure modes and embodiments similar to the technical solution of the present invention without departing from the spirit of the present invention and without making creative efforts, such structure modes and embodiments shall all fall within the protection scope of the present invention.

What is claimed is:

1. A method for manufacturing a novel busbarless solar photovoltaic module, wherein the method comprises the following steps:

use a metal connecting ribbon to connect a cell unit: move the metal connecting ribbon cut to a required length to a workstation, then place a cell at a required position, cut another section of metal connecting ribbon and place it on the cell, fix the metal connecting ribbon with a fixing piece and place another cell at the same time, and repeat the steps of cutting the metal connecting ribbon and placing the cell;

weld: transport the arranged metal connecting ribbons-cells-metal connecting ribbons-fixing pieces to a welding station, and weld the metal connecting ribbons with the cells by heating;

apply an adhesion point: apply an adhesion point at a designated position on the surface of the welded metal connecting ribbon;

cure: after curing the adhesion point on the front of a cell string, turn the cell string over, apply an adhesion point on the back of the cell string, and cure the adhesion point to complete the cell string; and make a complete circuit: arrange a plurality of the completed cell strings according to a certain rule, and connect these cell strings in a certain way through welding to form a required complete circuit;

a thickened portion is formed by screen printing at a designated position on a finger of the cell, and the designated position is a part of the finger that needs to be connected to the metal connecting ribbon;

in the step of curing, the cell string is turned over always at 40-140° C., and then the adhesion point is applied to the back of the cell and cured.

2. The method for manufacturing a novel busbarless solar photovoltaic module according to claim 1, wherein the cross-section of the metal connecting ribbon can be triangular, circular, or rectangular with an area of 0.005~0.55 mm².

3. The method for manufacturing a novel busbarless solar photovoltaic module according to claim 2, wherein the outer layer of the metal connecting ribbon is a coating of low melting point alloy or pure metal with a melting point of 120~250° C.

4. The method for manufacturing a novel busbarless solar photovoltaic module according to claim 3, wherein the metal connecting ribbon is soaked or coated with flux before welding, or a coating with a soldering effect is pre-coated on the surface of the metal connecting ribbon.

5. The method for manufacturing a novel busbarless solar photovoltaic module according to claim 1, wherein an implementation manner for the step of applying an adhesion point is coating without a fixture, the fixture is an integral fixture, and after the welding is completed, the fixture is removed and the adhesion point is applied to a corresponding position of the cell for fixing and cured.

6. The method for manufacturing a novel busbarless solar photovoltaic module according to claim 1, wherein an implementation manner for the step of applying an adhesion point is coating with a fixture, and when the adhesion point is applied, the fixture is used and the solder ribbon is always bound.

7. The method for manufacturing a novel busbarless solar photovoltaic module according to claim 5, wherein the adhesion point has a hemispherical or semi-ellipsoidal shape as a whole, and the bottom surface of the applied adhesion point is a circle or a short line formed by a dense arrangement of multiple points.

8. The method for manufacturing a novel busbarless solar photovoltaic module according to claim 1, wherein each of the cell strings comprises a head cell, a tail cell, and at least one intermediate cell between the head cell and the tail cell, and adjacent cells are electrically connected by the metal connecting ribbon.

9. The method for manufacturing a novel busbarless solar photovoltaic module according to claim 1, wherein in a series connection direction of the cell, a reserved busbar and a connecting fork connected to the finger are disposed in both end areas of the cell, the thickened portion is a transition section on the finger at an intersection position with the reserved busbar, one end of the transition section is connected to the reserved busbar and the other end thereof is connected to the finger; and the width of the transition section gradually narrows from the end close to the reserved busbar to the other end far away from the reserved busbar.

10. The method for manufacturing a novel busbarless solar photovoltaic module according to claim 1, wherein thickened portions are formed by screen printing at designated positions on fingers 1~8 at both ends of the cell, and the thickened portions are distributed at a spacing or in close proximity.

11. The method for manufacturing a novel busbarless solar photovoltaic module according to claim 10, wherein thickened portions are formed by screen printing at other positions of the cell except for the both ends thereof, and the thickened portions are distributed at a spacing or in close proximity.

12. The method for manufacturing a novel busbarless solar photovoltaic module according to claim 1, wherein the fingers and the thickened portions are formed by printing at one time.

13. The method for manufacturing a novel busbarless solar photovoltaic module according to claim 1, wherein a first paste is used to print the finger, a second paste is used to print the thickened portion, the first paste has better conductivity than the second paste, and the second paste has better adhesion than the first paste.

14. The method for manufacturing a novel busbarless solar photovoltaic module according to claim 1, wherein the step of applying an adhesion point is achieved by adhesive dispensing or printing.

15. The method for manufacturing a novel busbarless solar photovoltaic module according to claim 1, wherein in the step of welding, the alloy or metal on the surface of the metal connecting ribbon is melted and welded to the cell by heating.

16. A solar photovoltaic cell module manufactured by the method for manufacturing a novel busbarless solar photovoltaic module according to claim 1, wherein the solar photovoltaic cell module comprises the following:

a plurality of cell strings, wherein each of the cell strings comprises a head cell, a tail cell, and at least one intermediate cell between the head cell and the tail cell;

a light-receiving surface of one of adjacent cells is electrically connected to a backlight surface of the other one of the adjacent cells through a metal connecting ribbon, and a separate metal connecting ribbon is disposed on a backlight surface of the head cell and on a light-receiving surface of the tail cell respectively to electrically lead out the cell respectively; and the metal connecting ribbon is connected to the front and back of the cell by welding and intersects with a finger of the cell, and at least one adhesion point is also disposed on the metal connecting ribbon on the surface of the cell.

* * * * *